United States Patent [19]

Yasuda et al.

[11] Patent Number: 4,586,141
[45] Date of Patent: Apr. 29, 1986

[54] METHOD AND APPARATUS FOR AN ELECTRON BEAM EXPOSURE SYSTEM

[75] Inventors: Hiroshi Yasuda; Haruo Tsuchikawa, both of Yokohama; Junichi Kai, Tokyo; Koichi Kobayashi, Yokohama, all of Japan

[73] Assignee: Fujitsu Limited, Kawasaki, Japan

[21] Appl. No.: 536,322

[22] Filed: Sep. 27, 1983

[30] Foreign Application Priority Data

Sep. 27, 1982 [JP]  Japan ................... 57-167919

[51] Int. Cl.⁴ .............................. G06F 15/62
[52] U.S. Cl. ..................... 364/490; 250/396 R; 250/398; 250/492.2; 364/518
[58] Field of Search .......... 250/396 R, 398, 492.2, 250/492.3; 364/488, 489, 490, 491, 518

[56] References Cited

U.S. PATENT DOCUMENTS

| | | | |
|---|---|---|---|
| Re. 31,630 | 7/1984 | Goto et al. | 250/492.2 |
| 3,949,228 | 4/1976 | Ryan | 250/398 X |
| 4,132,898 | 1/1979 | Buelow et al. | 250/492.2 |
| 4,151,422 | 4/1979 | Goto et al. | 250/396 R X |
| 4,182,958 | 1/1980 | Goto et al. | 250/398 X |
| 4,199,689 | 4/1980 | Takigawa | 250/398 X |
| 4,218,621 | 8/1980 | Nakasuji et al. | 250/396 R X |
| 4,243,866 | 1/1981 | Pfeiffer et al. | 250/396 R X |
| 4,393,310 | 7/1983 | Hahn | 250/398 |
| 4,393,312 | 7/1983 | Collier et al. | 250/492.2 |
| 4,469,950 | 9/1984 | Taylor et al. | 250/398 X |

Primary Examiner—Errol A. Krass
Assistant Examiner—Edward R. Cosimano
Attorney, Agent, or Firm—Staas & Halsey

[57] ABSTRACT

An electron beam exposure system and method which varies beam size from pattern to pattern corresponding to the accuracy required for each pattern. In order to improve the throughput of the exposer, the beam size is adjusted to the maximum size useable for each pattern. The pattern is divided into rectangles equal to the maximum beam size determined by the pattern size or the accuracy required for the pattern. If a residual part of the pattern smaller than a rectangle remains, the rectangles are adjusted to be smaller than the maximum beam size, so the entire area of the pattern can be divided into equal size rectangles. The pitch and size of the beam are adjusted to this new beam size and exposure is repeated according to the new size rectangles. To increase the processing speed, all the patterns to be exposed in one process are checked as to their size and required accuracy, and the data necessary for the pattern generation such as beam size, pitch and number of exposures are calculated in advance and stored in a memory of a beam controller.

3 Claims, 7 Drawing Figures

FIG. 6.

| PATTERN SIZE ($m_x$) | NUMBER ($n_x$) | PITCH ($P_x$) | BEAM SIZE ($S_x$) |
|---|---|---|---|
| 0.05 μ | 1 | — | 0.05 μ |
| 0.10 | 1 | — | 0.10 |
| 0.15 | 1 | — | 0.15 |
| 0.20 | 1 | — | 0.20 |
| ⋮ | ⋮ | ⋮ | ⋮ |
| 3.95 | 1 | — | 3.95 |
| 4.00 | 1 | — | 4.00 |
| 4.05 | 2 | 2.025 μ | 2.05 |
| 4.10 | 2 | 2.05 | 2.05 |
| 4.15 | 2 | 2.075 | 2.10 |
| ⋮ | ⋮ | ⋮ | ⋮ |
| 7.95 | 2 | 3.975 | 4.00 |
| 8.00 | 2 | 4.00 | 4.00 |
| 8.05 | 3 | 2.68333 | 2.70 |
| → 8.10 | 3 | 2.70 | 2.70 |
| ⋮ | ⋮ | ⋮ | ⋮ |
| 11.95 | 3 | 3.98333 | 4.00 |
| 12.00 | 3 | 4.0 | 4.00 |
| 12.05 | 4 | 3.0125 | 3.05 |
| 12.10 | 4 | 3.025 | 3.05 |
| ⋮ | ⋮ | ⋮ | ⋮ |
| 99.95 | 25 | 3.998 | 4.00 |
| 100.00 | 25 | 4.00 | 4.00 |

METHOD AND APPARATUS FOR AN ELECTRON BEAM EXPOSURE SYSTEM

BACKGROUND OF THE INVENTION

This invention relates to a system for electron beam exposure where the size of the electron beam is varied in accordance with the accuracy required for each of the patterns to be exposed.

An electron beam is used to expose an extremely fine pattern on the substrate of integrated circuits (IC). Several proposals for electron beam exposure systems have been tried, for example, systems using a Gaussian type beam (an electron beam where the cross-section of the beam current density has a Gaussian distribution), a shaped type beam (a rectangular electron beam) and a variable type beam.

Recently, the process for electron beam exposure has shifted to using an electron beam exposure system having a constant beam current density and a variable beam size or shape. A system of this type can provide a sharper pattern edge and constant irradiation by the beam on all portions of the pattern.

Processing speed, a very important factor in actual manufacturing assembly line use, is determined by the time necessary for the beam to irradiate the entire substrate. In order to reduce the processing time it is possible to increase the beam current density and the beam size, but both are limited by blurring or spreading of the beam which causes pattern edge variations. Thus, it is desirable to use the maximum beam size allowable for the required accuracy. The accuracy requirement of each pattern on a IC die differs for each pattern, so it is desirable to change the beam size from pattern to pattern. In the art, the word "pattern" sometimes refers to a figure formed on a die or chip of an IC or to a component of the figures (generally, rectangles) used to create shapes or figures of the IC circuit. In general, in the electron beam technology art the word "pattern" takes on the latter meaning. In the following disclosure, therefore, pattern is defined as a component used to create the figures, that is, the figures on the IC circuit are divided into rectangular patterns, and each of the patterns is individually exposed by an electron beam. There are large numbers of patterns, including very small patterns that can be exposed by only one shot (usually one pulse or on-off sequence of an electron beam is called a shot) exposure, and large patterns which need a large number of exposures (shots) in a series of steps to expose the entire area of the pattern.

The phrases "step and expose" or "step and shot" refer to a process used to expose a pattern larger than the beam size involving an exposure, shifting the beam by a pitch equal to the beam size and repeating the exposure, etc., until the entire pattern is exposed. The above phrases should be distinguished from the phrase "step and repeat", which is a process of exposing all the patterns on a die, stepping to the next die and exposing the same patterns on the next die, repeating the process on the same slice of IC.

As the scale of a large scale integrated device LSI gets large, the number of patterns in a die to be exposed is increased to a few million, and the number of shots necessary to expose the patterns thereon is increased to more than ten million. Thus, an improvement in the process speed or the throughput of the electron beam exposure system process is urgently needed.

In the prior art, beam size has been very difficult to control and, as a consequence, electron beam exposure has been performed using a constant beam size determined by the finest (or smallest) pattern on the die, so that it takes a long time to expose all the patterns on a slice.

In a step and expose method, the pattern size, beam size and pitch are given, and the beam is controlled by a computer in which the programming for the millions of patterns is a problem. When a pattern size and its position are given, the computer divides the pattern into rectangles equal to the beam size, and exposure of the pattern is performed by repeating the step and expose process until all the rectangles are exposed. Even though the calculation time for each pattern is short, the computer must perform millions of calculations in order to expose all of the patterns on a slice, the total time for the calculations for millions of patterns is very long and thus, the electron beam exposure process is becoming a bottle neck for LSI (large scale integrated circuit) manufacturing. The present invention intends to relieve this bottle neck.

SUMMARY OF THE INVENTION

An object of the present invention, therefore, is to provide an electron beam exposure system having sufficient accuracy and providing high speed processing. The electron beam exposure system disclosed hereinafter is suitable for CAD (computer aided design) and CAM (computer aided manufacturing) systems.

Another object of the present invention is to provide an electron beam exposure system in which the pattern is divided into rectangles equal to the maximum beam size, and, if a residual part of the pattern, smaller than one of the rectangles remains, the maximum beam size is adjusted so that the entire area of the pattern is divided into equal size rectangles. The pitch and beam size are also adjusted to correspond to the adjusted rectangle.

In every IC pattern, even though each pattern is formed on the same die and chip, the accuracy requirement for each of the patterns is different. For example, on an LSI slice, the gate part of a MOSFET (metal oxide semiconductor type field effect transistor) requires the highest accuracy, and while the pattern of the bonding area to which a wire should be bonded does not require as much accuracy as the gate pattern, the patterns for wiring between the circuit elements require an intermediate accuracy. To attain a high processing speed, the beam size is adjusted to the maximum beam size usable for each pattern while maintaining the accuracy requirement for each pattern. The blur of an electron beam is roughly proportional to the beam current or beam size, thus the maximum size of the beam is restricted by both the size of the pattern and the accuracy requirement of the pattern. As the beam size is varied from pattern to pattern, the pitch of the beam deflection must also be varied.

According to the present invention, each pattern is divided into rectangles equal to the maximum beam size determined by the pattern size and the required accuracy. If a residual part of the pattern smaller than a rectangle equal to the maximum beam size remains, the size of the rectangles is adjusted to be smaller than the maximum beam size, so that the entire area of the pattern can be divided into equal size rectangles. The pitch, size of the beam and the number of shots are adjusted to correspond to the adjusted rectangles. The size of the residual area is sometimes different in length and breadth and the above-mentioned adjustment of the beam size should be done in both the X and Y directions, independent of each other. The adjusted new beam size is, therefore, slightly smaller than the maximum beam size. The step and expose process is repeated with the adjusted new beam size and when the exposure of a pattern is completed, the beam begins to expose the next pattern with a different beam size and pitch in the same manner as described above. All the processing is carried out automatically with the aid of a computer. The time necessary for calculating the layout of the beam on the pattern is eliminated so the process time for beam control is further reduced, and the throughput of the electron beam exposure system is greatly increased.

The objects and advantages of the present invention will be apparent from the accompanying drawings and the following detailed description of the preferred embodiments.

BRIEF DESCRIPTION OF THE DRAWINGS

FIG. 6 is an example of a pattern memory table stored in a memory in accordance with the present invention.

DESCRIPTION OF THE PREFERRED EMBODIMENTS

As previously mentioned, the present invention involves an electron beam exposure system, in which the size of an electron beam is adjusted, from pattern to pattern, to the maximum size usable for each pattern, in accordance with the accuracy required in the circuit design.

Figure 1:
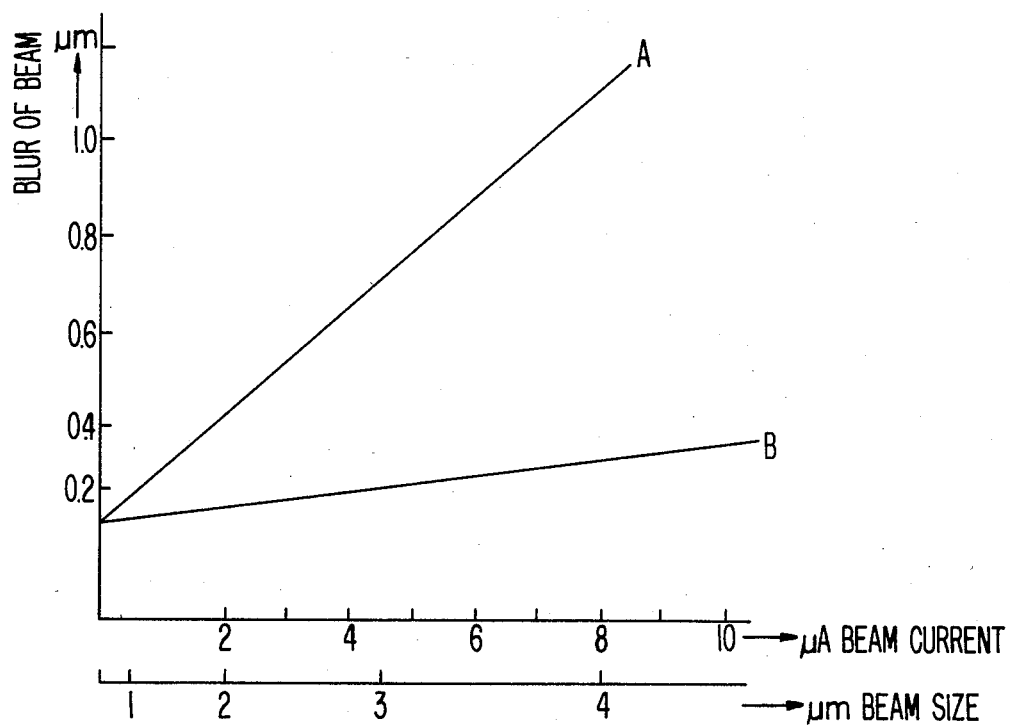
FIG. 1 is a graph of the relationship between the blur and the size of an electron beam.

FIG. 1 is a graph of the relationship between the blur and size of the electron beam experimentally obtained by the inventors using an electron beam exposer for IC processing. As can be seen in FIG. 1, the blur increases almost proportionately to the beam current as is expected to some extent from electron beam theory. Blur also increases with increased electron beam density and FIG. 1 is an example of blur for a beam current density of 50 A/cm$^2$. Blur (that is, the sharpness of the beam) is determined by a length or width at the edge of the beam projected onto a target in which the beam density falls from 90% to 10% of its maximum density.

The data in FIG. 1 was produced using an electron beam having a rectangular cross section and the abscissa is proportional to the cross-sectional area of the beam. The 2 $\mu$A point of the beam current on the abscissa of FIG. 1 corresponds to the beam size of $2\times2$ $\mu$m$^2$ and the 8 $\mu$A point of the beam current corresponds to $4\times4$ $\mu$m$^2$ of the beam size, etc., because the current density is equal to 50 A/cm$^2$ and, as a result, the size of a square beam is also shown.

The curve A in FIG. 1 shows the magnitude of blur against the beam current during an ordinary exposure while the curve B shows the blur when a refocussing process is applied to the exposure of curve A. As can be seen in the FIG. 1, the refocussing process can provide almost four times as sharp a beam as compared to an ordinary exposure. That means the refocussing process can provide almost four times as large a beam size as compared to the ordinary exposure process and, as a result, a process speed of almost four times faster than an unrefocussed beam can be expected. A refocussed electron beam, however, shifts its beam position to some extent and it is necessary to readjust the beam positioning. The process of refocussing is disclosed in U.S. patent application Ser. No. 454,168, filed on Dec. 28, 1982, which is assigned to the assignee of the present invention.

The sharpness of the beam shown in FIG. 1 is one of the best grades attainable with present-state-of-art exposers. In the figure, blur which is larger than 1 $\mu$m or so is not shown because a pattern that needs an accuracy of 1 $\mu$m or more can be generated by an optical exposer, therefore an electron beam exposer having a blur larger than 1 $\mu$m is unnecessary.

The electron beam exposer which is used in the present invention is a variable rectangular cross-sectional beam type exposer that provides a constant beam current density regardless of the beam size variation and includes means for refocussing. A detailed description of the electron beam exposer will be described hereinafter.

Figure 2:
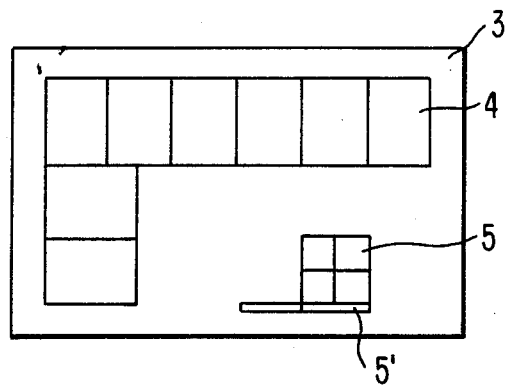
FIG. 2 is a schematic diagram of a pattern of an electron beam exposure according to the present invention.
Figure 3:
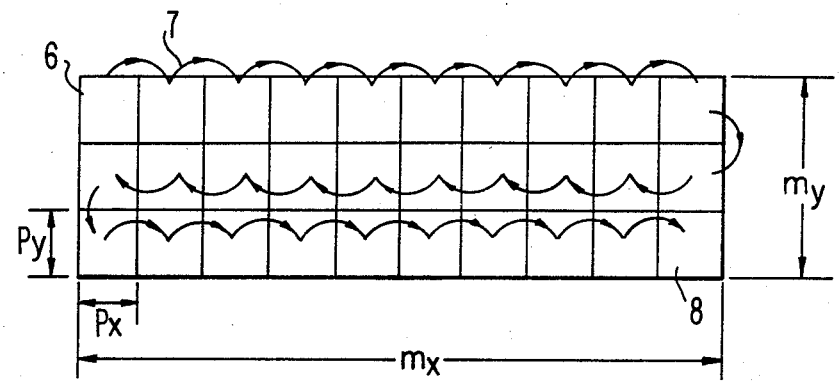
FIG. 3 is a schematic diagram of a portion of the pattern in FIG. 2 for explaining a step and expose method according to the present invention.

The method of electron beam exposure by the present invention will now be explained with respect to FIGS. 2 and 3. FIG. 2 is a schematic diagram of an example of patterns 4 and 5 to be exposed on IC substrate 3. An actual figure which is exposed on an IC die is more complicated and FIG. 2 shows only the pattern 4 which is large and in which accuracy is not critical, and the pattern 5 which is fine and requires a high accuracy. The accuracy requirements are specified by the circuit design.

Pattern 4 is exposed by a large size beam, while pattern 5 should be exposed by a small size beam in order to attain the accuracy needed. For the pattern 5', accuracy is critical in a lateral direction (Y direction) but not critical in a longitudinal direction (X direction), therefore the beam size for pattern 5' is limited by the Y direction accuracy. In any case, the pattern should be exposed with the largest size beam allowable based on the accuracy requirement to complete the exposure process as quickly as possible and thereby attain a high throughput.

When the beam size is specified, the whole area of the pattern 6 (FIG. 3), to be exposed by the specified beam, is divided into rectangles having a size equal to the above-mentioned beam size. If the maximum beam size usable is m$\times$m and then the pattern size should be exposed by a beam size m$_x\times$m$_y$ as shown in FIG. 3. Let the X and Y directions be the directions associated with the lengths m$_x$ and m$_y$ in the figure, respectively. The number of shots needed to cover the whole length m$_x$ is:

$$n_x = m_x/m \tag{1}$$

Usually m$_x$ cannot be evenly divided by m and if there is a residual area left over, n$_x$ is rounded up to the next larger integer. The size and pitch of the beam in the X direction is determined by:

$$p_x = m_x/n_x \tag{2}$$

In the same manner, the number of shots needed to cover the length of $m_y$ and the size and pitch of the step in the Y direction are determined by:

$$n_y = m_y/m \tag{3}$$

and $$p_y = m_y/n_y \tag{4}$$

respectively, in which $n_x$ and $n_y$ are integer numbers raised to the nearest unit.

In the above-described method for pattern division (layout of shots) the whole area of a pattern is divided into equal size rectangles having a size equal to the beam size which is specified in the accuracy requirement for the pattern. If there is a residual part of the pattern remaining, smaller than the beam size, the rectangle is adjusted to be slightly smaller in size, so that the residual area does not exist. The new rectangle (rectangle 8 in FIG. 3) is the largest beam size that equally divides the area and the exposure process is carried out with the new beam size, repeating a step and expose process as shown by the arrows 7 in FIG. 3.

It should be noted that the beam size determined by the above-mentioned method is, generally, almost a square, and very close to the specified size m×m of the design. But there are cases in which the beam size is quite different in the X and Y directions.

An example is shown in FIG. 2, in which a fine pattern 5 is exposed with a small, sharp beam just as described above, and the beam shape is almost square. The portion 5' is different in that the pattern is long in the X direction, and very short in the Y direction, requiring the sharpness to be greater in the Y direction than in the X direction. In such a case, the beam size is determined by the accuracy requirement for the Y direction. In the pattern 5' in FIG. 2, the width of the Y direction is narrow, so a very long beam in the X direction is possible, one shot in the Y direction is enough, and the pitch of the X direction is adjusted as before.

There are two other ways developed by the inventors for processing the residual area. These will be explained with respect to FIG. 4. For the sake of simplicity, the figure shows only one line of exposures, and only the right end part of the step and expose process.

Figure 4A:
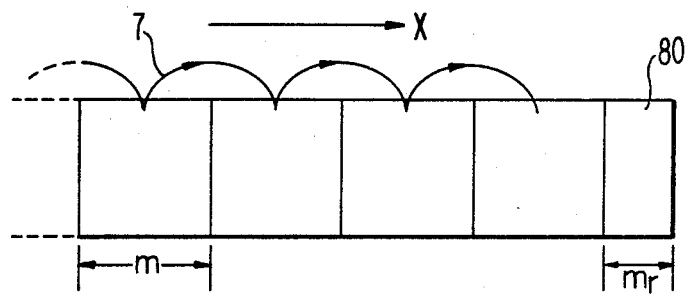
FIGS. 4(a) and 4(b) are portions of an end part of the pattern for explaining how the end part is exposed by the method for electron beam exposure according to the present invention.

In FIG. 4(a) the step and expose process begins from the left side of the drawing, and the exposure is repeated in the X direction following the arrows 7. In this case, the beam size is the maximum beam size m×m specified by the accuracy requirement. At the end of the line a residual area 80 remains which is smaller than the beam size. At this point the beam size is adjusted to cover the residual area with one shot. That is, the beam size in the X direction is made equal to the residual length $m_r$.

Figure 4B:
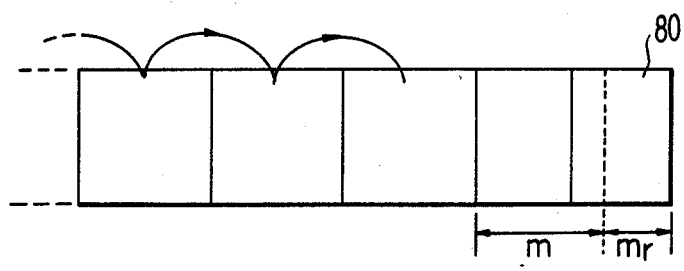

FIG. 4(b) shows another method used to expose the residual area starting from the left side of the drawing with the maximum beam size, in the same manner as the above-mentioned case. The exposure is stopped leaving one more shot before it reaches the residual area 80. At this point the beam size and pitch are adjusted to correspond to:

$$m_x = p_x = (m + m_r)/2 \tag{5}$$

and the residual area is exposed with two more exposure shots.

In the cases shown in FIGS. 4(a) and 4(b), an explanation is provided for the residual processing in the X direction only and it should be clear that the beam size should be adjusted in the Y direction in the same manner as in the X direction.

The figure to be exposed is also considered to be essentially composed of rectangular forms which is true for ordinary figures on ICs and LSIs. Therefore, the method described above can be conveniently applied to any IC and LSI production technique. In the rare case where a pattern includes a curved line or curved edge, the above-mentioned methods can be applied by simulating the curve using a plurality of rectangles having an appropriate size.

How an electron beam exposer is controlled in order to perform the above-mentioned step and expose method will be explained below with reference to FIG. 5. It will also be shown how the control is performed easily and quickly by adopting the system of the present invention.

Figure 5:
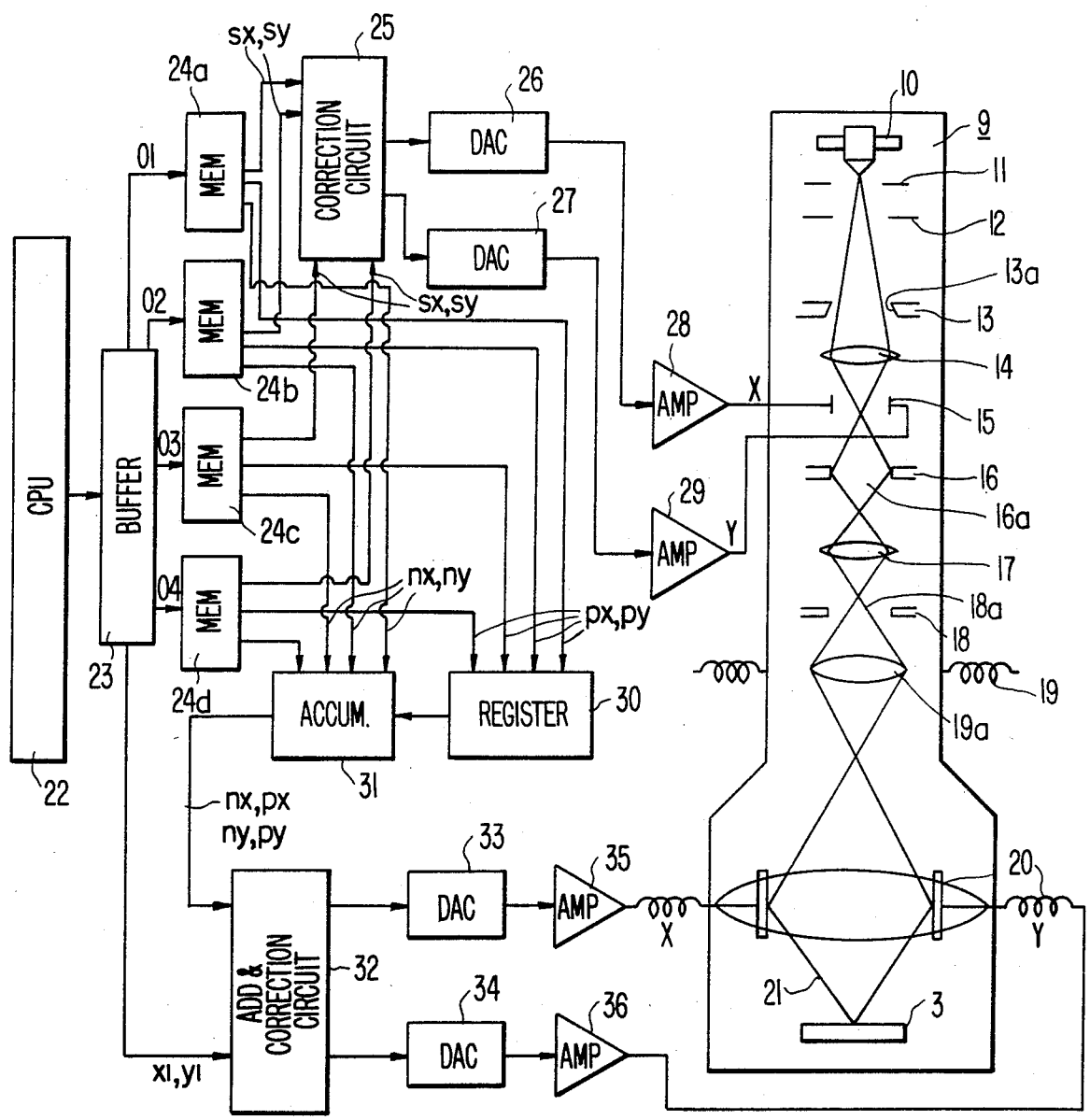
FIG. 5 is a block diagram of one embodiment of an electron beam exposure system according to the present invention.

FIG. 5 is a block diagram of one embodiment of an electron beam exposure system according to the present invention. A target 3 (an IC substrate) is placed in a vacuum chamber of an electron beam exposer 9, on which a pattern is to be exposed. The electron beam exposer has a cathode 10 which emits electrons in the form of a beam that pass through a grid 11 and an anode 12 to a first mask 13 having a rectangular aperture 13a. The electron beam passing through the aperture has a rectangular cross section. The rectangular electron beam is then focussed on a second mask 16 by a first lens 14. The beam is deflected onto the second mask 16 which has a rectangular aperture 16a by a first deflector 15. By deflecting the electron beam onto the second mask, the beam passing through the second aperture 16a can be shaped by a control signal (referred to hereinafter as a size signal), applied to the first deflector 15, into any desired size rectangular beam. The electron beam, having the desired rectangular cross section, passes through the lens 17 and electrode 18 which has an aperture 18a, and is focussed on a refocus lens 19a. Here the beam is refocussed to reduce its blur, and the position shift caused by the refocussing process is corrected. The coil 19 performs the computer controlled shift corrections. Further details of the refocussing process are set forth in U.S. application Ser. No. 454,168 and filed on Dec. 28, 1982, which is assigned to the assignee of the present invention. The electron beam 21 passes through the refocus lens 19a, is deflected by a second deflector 20 to expose a pattern on the substrate and focussed on the target 3 to expose a pattern on the substrate.

A preferred embodiment of the control means for controlling each of the electrodes of the electron beam exposer will be described with respect to FIG. 5. A central processing unit (CPU) 22 provides signals to control the cathode 10 and a blanking electrode (not shown), etc., which are not related explicitly to the present invention and are omitted from the description for the sake of simplicity. Only the control steps of the first and second deflectors for exposing a pattern by the step and expose method are described.

Since the present system is involved in a CAM (computer aided manufacturing) system, the design data for an IC circuit to be processed by an electron beam exposure method is entered into the CPU 22 by magnetic tape or magnetic disc (data may also be entered manually). The design data includes pattern information for all the patterns to be exposed on one IC die during one exposure process. The pattern information includes information related to accuracy, a position of a starting point and a pattern size. The pattern information is coded and stored by the CPU in a buffer-memory means 23 which needs a storing capacity of about 40 megabytes.

Reference numerals 24a, 24b, 24c and 24d designate memory means, in which each stores pattern data corresponding to a specific degree of accuracy. Pattern data refers to a set of data including the pattern length (pattern size data in both the X and Y directions), the number of shots (referred to hereinafter as number data), the pitch data, and the beam size data. The information is coded and stored in the memory means 24. For example, the memory 24a stores pattern data for a beam size of 4 μm, a large (coarse) size beam, the memory 24b stores pattern data for a beam size of 2.5 μm, an intermediate size beam and the memory 23c and 24d store pattern data for a fine (accurate) beam size of 2 μm and 1.6 μm, respectively. In this example, the degree of accuracy (that is, the beam size) is defined using four degree sizes, that is 4, 2.5, 2 and 1.6 μm, respectively, however, the degree of accuracy can be any size, and the number or different sizes can be increased at will. The pattern data in the memories 24 include all the pattern data necessary to expose any pattern during one process. One example of pattern data for a beam size of 4 μm is shown in FIG. 6 as a pattern list divided according to the pattern sizes, that is, a layout of the electron beam needed to expose the different size patterns. In the pattern size column ($m_x$) are listed the possible pattern lengths in the X direction. The possible pattern lengths are determined based on 0.05 μm steps. The division step size may be altered at will, but usually, 0.05 μm is sufficient for ordinary applications. In the number column, the number of shots needed to expose a pattern of length $m_x$ using a pitch $p_x$ and beam size $S_x$ are listed. For example, in the first line a pattern with a length of 0.05 μm can be exposed by a single shot having a beam size ($S_x$) of 0.05 μm. A pattern having a length of 8.10 μm (see the arrow in FIG. 6) can be exposed with three shots having a beam size of 2.70 μm and a pitch ($p_x$) of 2.70 μm, etc.

The beam size in the table is limited to 4 μm because the table lists the pattern data for a 4 μm beam (the coarsest beam). A pattern up to 4 μm is exposed by a single shot smaller than 4 μm, but a pattern larger than 4 μm is exposed using the step and expose method with a 4 μm beam size. The data in the table can easily be calculated for any size pattern using the equations (1)–(4) when the accuracy required for the pattern (maximum beam size) and pattern size are given. The data may be calculated from pattern to pattern while the exposure process is carried out, however, as noted previously, if such calculations are carried out during the exposure process, the millions of calculations cause a processing delay. Equation (5) calculates the residual beam size data for the last shot or next to the last shot when a residual part of the pattern remains and the beam size is changed in accordance with this value. The residual beam size data, and the pitch data and number data for the residual data can also be a part of the table in FIG. 6 which is stored in memories 24.

Even though the number of patterns needed to expose an IC circuit is large, not as many types of patterns are necessary to make up the IC circuit. Therefore, the pattern size needed to finish an LSI circuit can be checked during the circuit design and the pattern data, as shown in FIG. 6, and can easily be prepared in advance for all patterns necessary to expose the IC circuit. The calculations for the pattern data list can be done by another calculator or the CPU, and the list can be stored in advance in the memories 24a–d. The list shown in FIG. 6 is only for the X direction, however, similar calculations are performed and the list of pattern data are prepared and stored in the memories 24 for the Y direction, and the degree of accuracy and the number of degrees can be determined at will. The capacities of the memory means 24a, 24b, 24c and 24d are usually required to be a few tens of kilobytes each, depending of course, on the number of types of patterns and the accuracy required.

Referring again to FIG. 5, the first pattern information is read out from the buffer memory 23 by a command from the CPU 22. The pattern information includes the accuracy information for the first pattern. The coarse degree of accuracy (mode 1) has a specified code 01 by which the memory 24a is accessed. Then using the pattern size information, the address corresponding to the pattern length is accessed and pattern data stored in the corresponding address is read out. Similarly, corresponding to the accuracy information, modes 2, 3 and 4 for other degrees of accuracy are specified by codes 02, 03 and 04, memories 24b, 24c and 24d are accessed respectively, and corresponding pattern data are read out. Beam size data $S_x$ and $S_y$, read out from the memories 24, are sent to a conventional correction or beam size change circuit 25. Correction means is needed to correct the shift in the electron beam in the Y direction due to the controlled shift in the X direction, and vice versa, when the size of the beam changes and to correct variances between electron beam exposure systems. Correction circuit 25 performs a conventional "coordinate transformation" which shifts, rotates and magnifies the figures to be exposed so that a precise electron beam exposure occurs using various beam sizes. In this example, the correction circuit 25 precisely corrects the beam size to equal 4 μm when the code 01 is specified, and when other codes are specified, the correction circuit 25 corrects the beam.

The corrected X and Y beam size signals are input to digital analog converters (DAC) 26 and 27, converted to analog signals, amplified by amplifiers 28 and 29 and supplied to respective X and Y deflectors of the first deflector 15, as a size signal. Thus, the beam size focussed on the substrate 3 is adjusted to a specified size that is equal to the maximum size usable for the pattern and adjusted to a residual beam size so that no residual part of the pattern, when the pattern is divided by rectangles equal to the beam size, remains.

Pitch data $p_x$, $p_y$ and the number data $n_x$, $n_y$ included in the pattern data read out from the memories 24 in the above-mentioned process, are stored in a register 30 and an accumulator 31, respectively. The accumulator 31 provides data each time a shot occurs equal to $n_x \times p_x$ and $n_y \times p_y$ in the following manner. At first, $n_x$ and $n_y$ equal 0 and after each shot, $n_x$ is increased by 1 until $n_x$ equals the number data $n_x$ of the pattern, then 1 is added to $n_y$. Now after each shot, $n_x$ is decreased by 1, and the shots are repeated until $n_x$ becomes 0. When $n_x$ equals 0, 1 is added to $n_y$ making it 2, and after each shot, $n_x$ is increased by 1. This process is repeated for each shot, until $n_x$ and $n_y$ are equal to the number specified by the number data.

Each time a shot occurs, the data $n_x \times p_x$ and $n_y \times p_y$ are sent to an adder and correction circuit 32, the starting position data $x_1$ and $y_1$ supplied in the starting position information, are supplied to the adder 32, from the buffer memory 23 and the starting position data $x_1$ and $y_1$ are respectively added to $n_x \times p_x$ and $n_y \times p_y$. The adder and correction circuit 32 is a conventional digital adder which incorporates a conventional correction circuit, as discussed above with respect to correction circuit 25. Data is input to this circuit 32, added and then shifted for a precise electron beam exposure in the same manner as the correction circuit 25. The added data are used to shift the electron beam step by step to expose the whole area of the pattern by the step and expose method as shown by the arrows 7 in FIG. 3. The added data are supplied to each digital-to-analog converter (DAC) 33 and 34, respectively, converted to analog signals, amplified by amplifiers 35 and 36, respectively, and input to the second deflector 20 of the electron beam exposer as position signals.

In this manner, the electron beam exposer exposes the first pattern on the substrate using the step and expose method. When the first pattern is exposed, the CPU executes a command to read the next pattern information for the next pattern in the buffer memory 23 of FIG. 5 and the above process is repeated. The step and expose process is repeated for the following patterns with the specified accuracy for the patterns, until all the patterns are exposed.

In the above description, only one method for processing the residual part of the pattern, divided into rectangles equal to the beam size, was described. The method can easily be applied to the other two methods of beam alignment which the inventors recommend, that is, exposing the pattern with the maximum beam size determined by the accuracy requirement. This process is no different from that described above except that the pattern data is altered, using the residual beam size data stored along with the main beam size in the beam size data column of FIG. 6, so that a single shot or two shots for the residual part are required.

The above-described process provides an exposure method for an IC substrate using the maximum useable beam size allowable for each pattern. Moreover, as has been explained above, the present system has eliminated the calculation time necessary for each pattern, thus, increasing the processing speed. In fact, by using the exposure system of the present invention, the throughput of the electron beam exposer is approximately twice as high as compared to prior systems.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to as falling within the scope of the invention.

What is claimed is:

1. An electron beam exposure method for exposing patterns on a substrate, comprising the steps of:
   (a) storing pattern information, including accuracy information, starting position information and pattern size information for the patterns;
   (b) storing pattern data, including number data, pitch data and beam size data in dependence upon the pattern information, said step (b) comprising the substeps of:
   (bi) dividing each of the patterns into rectangles equal to a maximum size of the beam in dependence upon the accuracy information;
   (bii) generating the beam size data;
   (biii) adjusting the beam size data to a new beam size if a residual area of the patterns smaller than the maximum beam size remains, the new beam size being smaller than the maximum beam size thereby allowing each of the patterns to be divided into an integer number of new rectangles having a size equal to the new beam size; and
   (biv) generating the pitch data and the number data in dependence upon the adjusted beam size data;
   (c) selecting the pattern data in dependence upon the accuracy information and the pattern size information;
   (d) providing a beam size signal in dependence upon the beam size data;
   (e) providing position signals in dependence upon the pitch data, the number data and the starting position information;
   (f) deflecting the beam in accordance with the beam size signal; and
   (g) deflecting the beam onto the substrate in accordance with the position signals.

2. An electron beam exposure method for exposing patterns on a substrate, comprising the steps of:
   (a) storing pattern information, including accuracy information, starting position information and pattern size information for the patterns;
   (b) storing pattern data, including number data, pitch data and beam size data in dependence upon the pattern information, said step (b) comprising the substeps of:
   (bi) dividing each of the patterns into rectangles equal to the maximum beam size in dependence upon the accuracy information;
   (bii) generating beam size data corresponding to a main part of the pattern, the main part being an integer multiple size of the maximum beam size, and the beam size data, the pitch data and the number data being generated in dependence upon the maximum beam size; and
   (biii) generating beam size data, pitch data and number data corresponding to a residual area which is smaller than the maximum beam size;
   (c) selecting the pattern data in dependence upon the accuracy information and the pattern size information;
   (d) providing a beam size signal in dependence upon the beam size data;
   (e) providing position signals in dependence upon the pitch data, the number data and the starting position information;
   (f) deflecting the beam in accordance with the beam size signal; and
   (g) deflecting the beam onto the substrate in accordance with the position signals.

3. An electron beam exposure method for exposing patterns on a substrate, comprising the steps of:
   (a) storing pattern information, including accuracy information, starting position information and pattern size information for the patterns;
   (b) storing pattern data, including number data, pitch data and beam size data in dependence upon the pattern information, said step (b) comprising the substeps of:
(bi) dividing each of the patterns into rectangles equal to the maximum beam size in dependence upon the accuracy information;
(bii) generating beam size data corresponding to a main part of the pattern;
(biii) generating beam size data corresponding to a residual part of the pattern;
(biv) combining a portion of the main part, the residual part and the remainder of the main part, and forming a combined portion and a remaining portion;
(bv) generating the pitch data and the number data in dependence upon the maximum beam size for the remaining portion; and
(bvi) changing the beam size data corresponding to the residual part in dependence upon the size of the combined portion, and generating pitch data and number data for the combined portion;
(c) selecting the pattern data in dependence upon the accuracy information and the pattern size information;
(d) providing a beam size signal in dependence upon the beam size data;
(e) providing position signals in dependence upon the pitch data, the number data and the starting position information;
(f) deflecting the beam in accordance with the beam size signal; and
(g) deflecting the beam onto the substrate in accordance with the position signals.

* * * * *